United States Patent [19]

Futaki et al.

[11] Patent Number: 4,617,661

[45] **Date of Patent: * Oct. 14, 1986**

[54] ELECTRONIC COPYING MACHINE

[75] Inventors: Kenji Futaki, Kawasaki; Hitoshi Dekura, Tokyo, both of Japan

[73] Assignee: Kabushiki Kaisha Toshiba, Kawasaki, Japan

[ * ] Notice: The portion of the term of this patent subsequent to Feb. 19, 2002 has been disclaimed.

[21] Appl. No.: 669,229

[22] Filed: Nov. 7, 1984

Related U.S. Application Data

[62] Division of Ser. No. 363,387, Mar. 29, 1982, Pat. No. 4,500,971.

[30] Foreign Application Priority Data

Mar. 31, 1981 [JP] Japan .................................. 56-48073

[51] Int. Cl.⁴ .............................................. G01R 31/28

[52] U.S. Cl. .................................... 371/20; 355/14 C; 364/513.5; 371/29

[58] Field of Search ........................ 371/15, 17, 18, 29, 371/20; 355/14 C; 324/73 R; 364/200 MS File, 900 MS File, 513.5; 381/51

[56] References Cited

U.S. PATENT DOCUMENTS

| | | | |
|---|---|---|---|
| 3,575,589 | 4/1971 | Neema et al. | 371/29 X |
| 4,034,194 | 7/1977 | Thomas et al. | 371/18 |
| 4,135,662 | 1/1979 | Dlugos | 371/29 |
| 4,438,326 | 3/1984 | Uchida | 364/900 X |
| 4,498,130 | 2/1985 | Uchida | 371/17 X |
| 4,499,581 | 2/1985 | Miazga et al. | 371/20 |

*Primary Examiner*—Charles E. Atkinson
*Attorney, Agent, or Firm*—Cushman, Darby & Cushman

[57] ABSTRACT

Disclosed is an electronic copying machine comprising detecting means for detecting an operating status of a copying machine main body, audio information storage means for storing predetermined audio information, audio information synthesizing means for reading out the audio information from said audio information storage means and for synthesizing the audio information, voice output means for converting the audio information synthesized by said audio information synthesizing means to a voice and for outputting the voice, and control means for detecting by said detecting means an operation made by an operator when trouble occurs in said copying machine main body and controlling said detecting means, said audio information storage means, said audio information synthesizing means and said audio output means so as to signal, with a voice, an operator an operation to be performed subsequently.

1 Claim, 22 Drawing Figures

ELECTRONIC COPYING MACHINE

This is a division of application Ser. No. 363,387, filed Mar. 29, 1982, now issued as U.S. Pat. No. 4,500,971 on Feb. 19, 1985.

BACKGROUND OF THE INVENTION

The present invention relates to an electronic copying machine with fault detection apparatus.

In a conventional electronic copying machine, for several tens of seconds to a few minutes, a wait mode is displayed at a display unit arranged on an operator's panel after power is supplied until the copying machine is ready for the copying operation. Further, information for completion of continuous copying, jam information, paper empty information and the like are also indicated at the display unit.

However, the electronic copying machine of this type has the following problems.

When an urgent copying operation is required when the machine is in the stop mode, the operator must wait, while looking at the display unit, for a certain period of time after power is supplied until the copying machine is ready for copying. Thus, this results in a waste of time. Further, since the copying completion information, jam information, paper empty information and so on are only displayed at the display unit, the operator who is away from the copying machine will not know whether continuous copying has been completed, resulting in working inefficiency. Further, the arrangement of the display unit tends to be complicated in accordance with the sophisticated functions of the copying machine. Thus, the operator may fail to notice instructions at the display unit, and perform an erroneous operation.

Also, copying machine maintenance, such as clearing jams, can involve a series of steps, thus rendering such maintenance complicated.

The prior art is disclosed in Japanese Patent Disclosure No. 55-74,533 by M. Tada et al, filed on June 5, 1980. This patent application discloses a copying machine which detects the status of the copying machine and produces audio information in correspondence with the detected status. However, this copying machine does not have means for producing audio or visual information for reminding the operator of the subsequent series of steps which must be made by him for correcting mechanical trouble of the copying machine, for example, jamming.

SUMMARY OF THE INVENTION

The present invention provides an electronic copying machine comprising a reliable voice generating function for properly signalling various operating statuses to an operator without imposing trouble on the operator so that the operator can perform proper operations. Also, the present invention communicates to an operator the steps necessary for correcting problems and monitors the performance of each step. As the device detects that a step has been completed, the next step is communicated.

An electronic copying machine according to the present invention comprises a status detecting section, an audio information storage section, an audio information synthesizing section for reading out audio information from the audio information storage section and for synthesizing the audio information, a voice output section for converting the audio information synthesized in the audio information synthesizing section into a voice and for outputting the voice, and a control section for controlling the status detecting section, the audio information storage section, the audio information synthesizing section and the audio output section. Abnormal status information is signalled with a voice in response to an abnormal status detected by the status detecting section, an operation made by the operator in response to the audio output is detected by the status detecting section, and instruction information for the subsequent operation to be made by the operator is further signalled with the voice.

BRIEF DESCRIPTION OF THE DRAWINGS

Other objects and features of the present invention will be apparent from the following description taken in connection with the accompanying drawings in which.

DETAILED DESCRIPTION OF THE PREFERRED EMBODIMENTS

Figure 1:
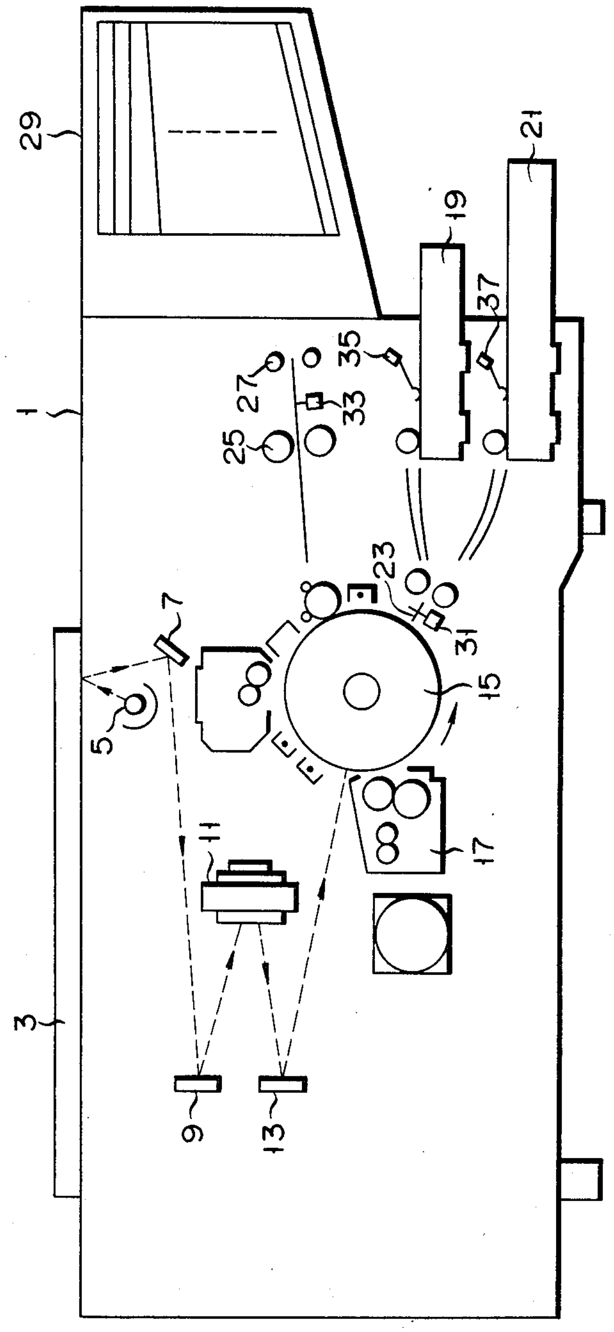
FIG. 1 is a view schematically showing the overall structure of an electronic copying machine according to the present invention.

Referring to FIG. 1, a document table 3 is disposed on the upper part of an electronic copying machine main body 1. Light is emitted from an exposure lamp 5 and radiated on the document table 3. The light is reflected by a document (not shown) on the document table 3 and radiated on a photosensitive drum 15 through mirrors 7 and 9, a lens 11 and a mirror 13. At this time, the relative movement between the document table 3 and the exposure lamp 5 makes it possible to radiate light on the entire surface of the document. As a result, an electrostatic latent image corresponding to data on the document is formed on the photosensitive drum 15. This electrostatic latent image is developed in a developing unit 17 and formed as a visible image. This visible image is transferred on the surface of a recording paper sheet which is fed from a paper feed cassette 19 or 21 through a paper transfer guide 23. This copying paper sheet is fed out to a sorter 29 through heat rollers 25 and a paper transfer guide 27. Paper detecting switches 31 and 33 are disposed at the paper transfer guides 23 and 27, respectively. Further, paper-out detecting switches 35 and 37 are disposed at positions corresponding to the paper feed cassettes 19 and 21.

Figure 2:
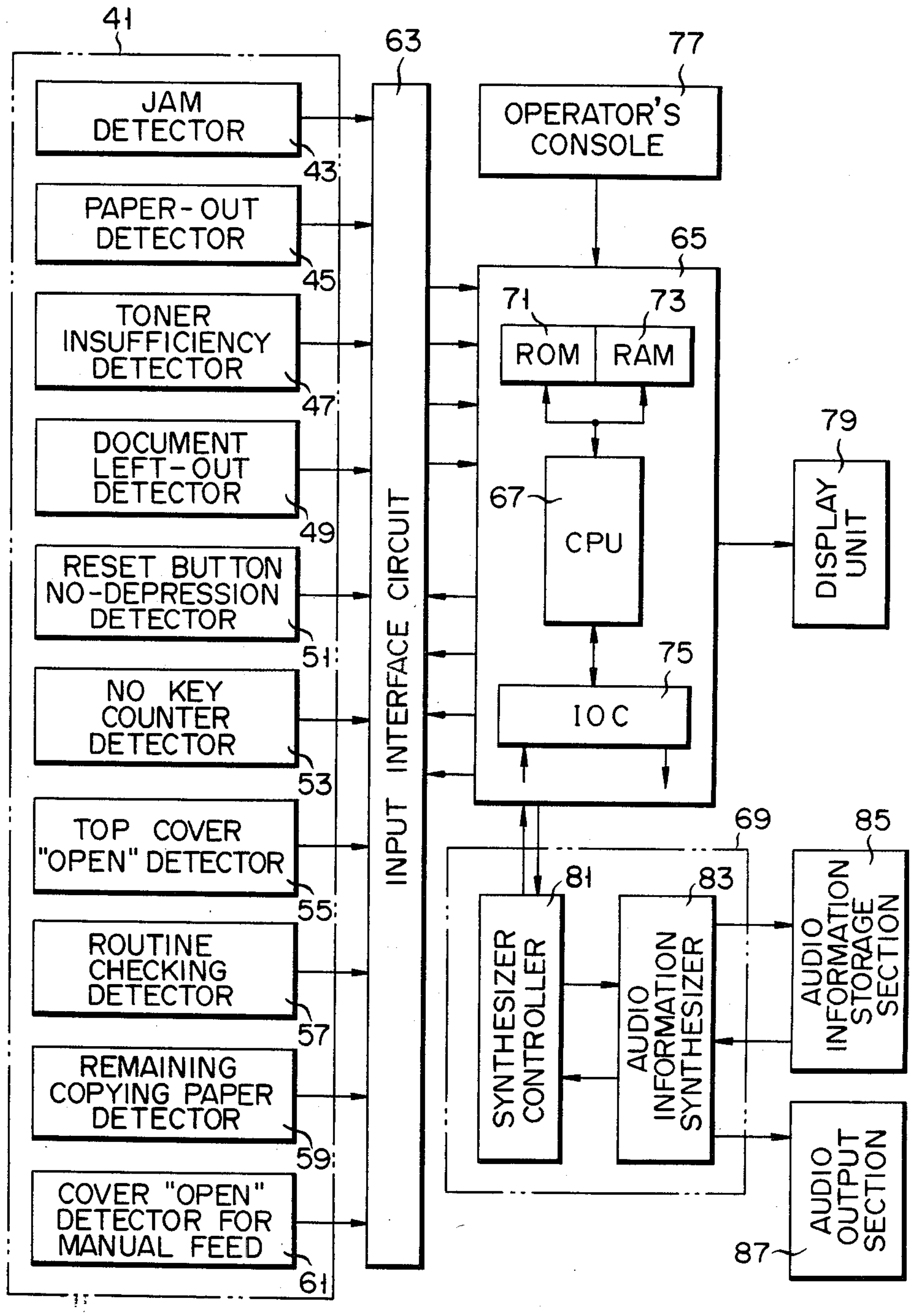
FIG. 2 is a block diagram schematically showing a control circuit of the electronic copying machine according to the present invention.

FIG. 2 is a block diagram schematically showing a control circuit of the electronic copying machine according to the present invention. Referring to FIG. 2, an abnormal status detecting section 41 comprises a jam detector 43, a paper-out detector 45, a toner insufficiency detector 47, a document left-out detector 49, a reset button no-depression detector 51, a no key counter detector 53, a top cover "open" detector 55, a routine checking detector 57, a remaining copying paper detector 59, and a cover "open" detector for manual feed 61. The abnormal status detecting section 41 is connected to a main control section 65 through an input/output interface circuit 63. The main control section 65 comprises a 4-bit microprocessor which has a central processing unit 67 (to be referred to as a CPU hereinafter) for controlling the overall operation, a read-only memory 71 (to be referred to as a ROM hereinafter) for storing sequence programs for copying processing operations such as document feed, paper feed/transfer, charge, exposure, development, fixing and so on and a control program for controlling an audio information synthesizing section 69 to be described later, a random access memory 73 (to be referred to as a RAM) for storing data required in the CPU 67, and an input/output controller 75 (to be referred to as an IOC hereinafter) for controlling the input and output of signals or data. Further, the main control section 65 is connected to an operator's console 77, a display unit 79 and the audio information synthesizing section 69.

The audio information synthesizing section 69 comprises a synthesizer controller 81 which are mainly constituted by a 4-bit microprocessor and an audio information synthesizer 83. An audio information storage section (ROM) 85 and an audio output section 87 are connected to the audio information synthesizing section 69. The audio information synthesizing section 69 reads out audio information from the audio information storage section 85 and synthesizes the audio information on the basis of an instruction made by the main control section 65. The audio information synthesized in the audio information synthesizing section 69 is converted to a voice in the audio output section 87 and produced thereby.

Figure 3:
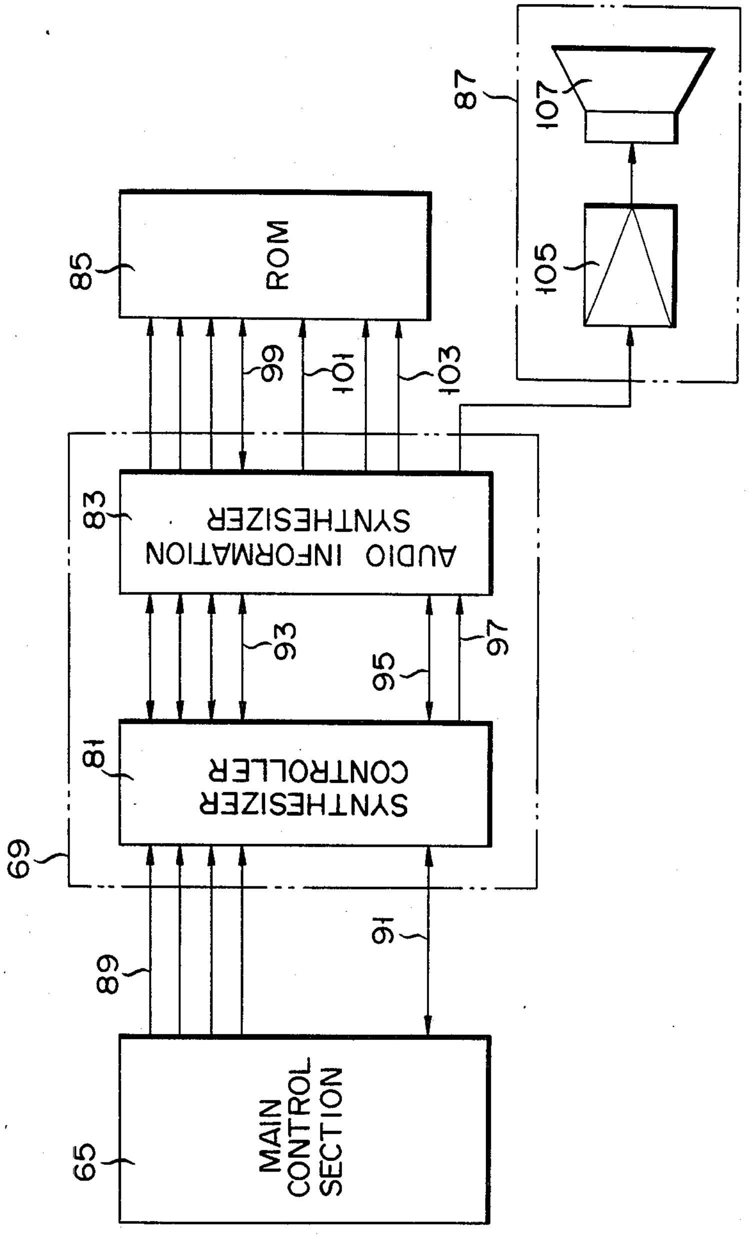
FIG. 3 is a detailed block diagram of the main part of the control circuit of FIG. 2.

FIG. 3 is a detailed block diagram of the main part of the control circuit of FIG. 2. The main control section 65 and the synthesizer controller 81 are connected by unidirectional 4-bit data buses 89 and a bidirectional control bus 91. The synthesizer controller 81 and the audio information synthesizer 83 are connected by bidirectional 4-bit data buses 93, a control bus 95 and a clock bus 97. The audio output section 87 comprises an amplifier 105 and a speaker 107. The gain of the amplifier 105 is changed to control the volume level of the voice.

Figure 4:
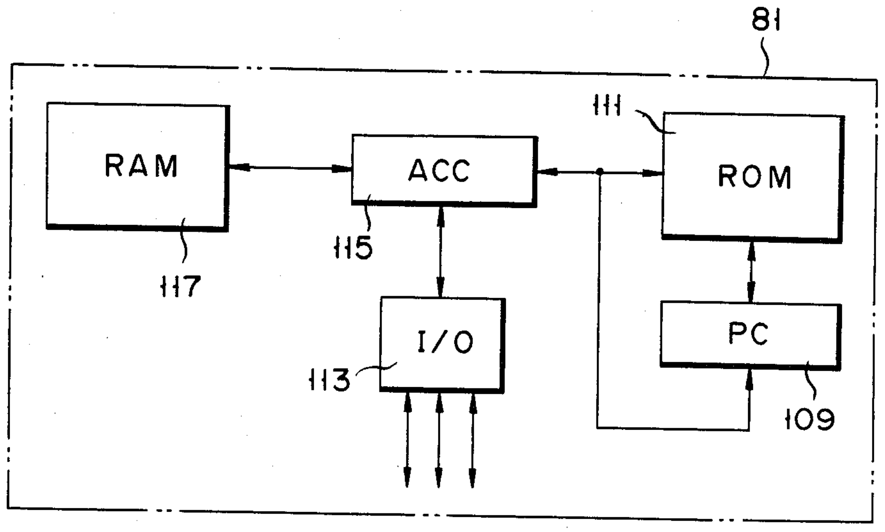
FIG. 4 is a detailed block diagram of the synthesizer controller of FIG. 3.

FIG. 4 is a detailed block diagram of the synthesizer controller of FIG. 3. The synthesizer controller 81 controls a program counter 109 so as to perform a count-up operation and reads out a program by sequentially accessing addresses of a program memory (ROM) 111. An operation is performed between an accumulator (ACC) 115 and a data memory (RAM) 117 on the basis of data which is input to or output from an I/O port 113. The operated results are output from the I/O port 113.

The table below shows audio information stored in the ROM 85 as follows. For example, audio information corresponding to "Please wait" (in Japanese unless otherwise specified hereinafter) is stored in address $N_1$ through address $N_2$-2 indicated by label "out 0" of the ROM 85. Further, an end bit corresponding to address $N_2$-1 stores data which indicates the end of the audio information.

TABLE

| Label | Addresses of ROM 88 | Storage Contents |
|---|---|---|
| OUT 0 | $N_1$ through $N_2$-2 | Please wait. |
| | $N_2$-1 | End of information. |
| OUT 1 | $N_2$ through $N_3$-2 | Ready for copying. |
| | $N_3$-1 | End of information. |
| OUT 2 | $N_3$ through $N_4$-2 | Please close the cover. |
| | $N_4$-1 | End of information. |
| OUT 3 | $N_4$ through $N_5$-2 | Please remove paper. |
| | $N_5$-1 | End of information. |
| OUT 4 | $N_5$ through $N_6$-2 | Please feed paper. |
| | $N_6$-1 | End of information. |
| OUT 5 | $N_6$ through $N_7$-2 | Please add toner. |
| | $N_7$-1 | End of information. |
| OUT 6 | $N_7$ through $N_8$-2 | Please attach the key counter. |
| | $N_8$-1 | End of information. |
| OUT 7 | $N_8$ through $N_9$-2 | Please press the reset button. |
| | $N_9$-1 | End of information. |
| OUT 8 | $N_9$ through $N_{10}$-2 | Did you take the document? |
| | $N_{10}$-1 | End of information. |
| OUT 9 | $N_{10}$ through $N_{11}$-2 | Copying is completed. |
| | $N_{11}$-1 | End of information. |
| | $N_{11}$ through $N_{12}$-2 | Please call for service personnel. |
| | $N_{12}$-1 | End of information. |
| | $N_{12}$ through $N_{13}$-2 | Manual feed is being performed. |
| | $N_{13}$-1 | End of information. |

While the main control section 65 controls the copying operation, the abnormal status detecting section 41 detects the presence or absence of abnormal status. When the main control section 65 judges that warning or guidance with a voice (to be referred to as an audio output hereinafter) is required, this control signal is supplied to the synthesizer controller 81 through the control bus 91. Further, the main control section 65 transfers data which indicates the current operating status to the synthesizer controller 81 through the data buses 89. As a result, the synthesizer controller 81 supplies a start instruction to the audio information synthesizer 83 through the control bus 95. Simultaneously, the synthesizer controller 81 supplies a signal which indicates that the audio output to the control section 65 through the control bus 91 is being performed.

Further, the synthesizer controller 81 translates the content of information supplied from the main control section 65 and judges the content of information, that is, the correspondence between the content of information and a corresponding address of the ROM 85. The judged result is transferred to the audio information synthesizer 83 through the data buses 93. The synthesizer controller 81 then supplies an audio output start signal to the audio information synthesizer 83 through the control bus 95.

As a result, the audio information synthesizer 83 supplies a signal which indicates that the audio output to the synthesizer controller 81 through the control bus 95 is being performed and simultaneously starts synthesizing the audio information. In particular, address accessing information is transferred to the ROM 85 through the data buses 99. The storage content of this address, that is, audio information is read out and synthesized. The synthesized audio information is supplied as the audio information signal to the amplifier 105. The amplified audio information signal is supplied to the speaker 107 and produced thereby as an actual voice. Meanwhile, the ROM 85 is being controlled through a control bus 103. When the end information is read out from the ROM 85, the audio information synthesizer 83 stops synthesizing the audio information. The audio information synthesizer 83 then supplies an audio output end signal to the synthesizer controller 81 through the control bus 95. As a result, the synthesizer controller 81 initializes the internal status and supplies the audio output end signal to the main control section 65. The synthesizer controller 81 is then maintained in the wait mode until the next audio output is required. On the other hand, the main control section 65 is maintained in the wait mode or in another mode while the audio output is performed. When the main control section 65 receives the audio output end signal from the synthesizer controller 81, the next operation is initiated. At this time, the main control section 65 mainly depends on the audio output control by the synthesizer controller 81, and the load imposed on the main control section 65 is reduced. Therefore, various kinds of control operations by the main control section 65 are not restricted. Especially, the display control at the display unit 79 can be performed as usual.

The audio output control mode of operation will be described in detail with reference to the flow charts in FIGS. 5A through 5N.

When power is supplied in step 121, a reset pulse is supplied to the main control section 65, the synthesizer controller 81 and the audio information synthesizer 83 in step 123. Therefore, internal counters, flip-flops and so on are reset. Further, the contents of the RAM 117 which are stored in the synthesizer controller 81 are cleared. When the program counter 109 of the synthesizer controller 81 counts up, a program is read out from the ROM 111. Thus, step 125 is performed. In step 125, a door switch signal from a door switch disposed on a top cover (not shown) for protecting the copying machine main body 1 is received through the I/O port 113. This signal is then transmitted to the accumulator 115 and it is checked if the door switch is turned on (the cover is closed). If the door switch is turned on, a door close flag (DRC-F) is reset in step 127. The program then advances to step 129. On the other hand, when the door switch is turned off (the cover is open), the program advances to step 205. In step 205, a key flag (KEY-F), a paper empty flag (PEP-F), a wait flag (WAT-F) and a ready flag (RDY-F) within the RAM 117 are reset. The program then advances to step 207. The DRC-F is a flag used for performing an audio output "Please close the cover" once. The KEY-F is a flag used for performing an audio output "Please attach the key counter". The PEP-F is a flag used for performing an audio output "Please feed paper". The WAT-F is a flag used for performing an audio output "Please wait". The RDY-F is a flag used for performing an audio output "Ready for copying".

In step 207, it is checked if the DRC-F within the RAM 117 is set, that is, if the audio output "Please close the cover" has been performed. If the DRC-F is not set, the DRC-F is set in step 211. The program then advances to step 213. On the other hand, if the DRC-F is set, the program advances to step 209. A mode ("OUT2") for performing the audio output "Please close the cover" is set in step 213. Further, in step 215, a VOUT subroutine is called for performing the audio output described above. After the VOUT subroutine is executed, the program returns to step 125.

On the other hand, it is checked in step 209 if the initial copying operation is performed, that is, if the copy button is turned on. If the copy button is depressed, the program advances to step 213. Further, the VOUT subroutine is executed in step 215 and the program returns to step 125. On the other hand, if the copy button is not turned on, the program directly returns to step 125. In this manner, when the cover is open, the audio output "Please close the cover" is performed once. Thereafter, every time the copy button is depressed, the same audio output is performed. This series of operations is repeated until the cover is closed.

The VOUT subroutine will be described below (in FIG. 5P). The synthesizer controller 81 supplies a VOC (voice out control) signal corresponding to the content of the audio output to the audio information synthesizer 83 through the I/O port 113 in step 299. Simultaneously, the synthesizer controller 81 receives a busy signal which indicates that the audio output from the audio information synthesizer 83 through the I/O port 113 is being performed. As a result, when the busy signal is set to logic "0", that is, when the audio output is cancelled, a SRT (start) signal which indicates the initiation of the audio output is output to the audio information synthesizer 83 through I/O port 113 in step 301.

On the other hand, when the busy signal is set to logic "1", audio information synthesization is currently performed in the audio information synthesizer 83. Thus, the synthesizer controller 81 is maintained in the wait status. When the audio information synthesizer 83 receives the SRT signal, an address of ROM 85 is accessed in response to the VOC signal and audio information is sequentially read out and synthesized. This synthesized audio information is supplied as the audio information signal to the speaker 107 through the amplifier 105. Thus, the audio information signal is converted to an actual voice.

When the audio output is being performed, the audio information synthesizer 83 outputs the busy signal of logic "1" in step 303. The SRT signal is reset by the synthesizer controller 81 in step 305. Then, the synthesizer controller 81 is maintained in the wait status. When the end information is read out from the ROM 85 to the audio information synthesizer 83, the audio information synthesizer 83 stops synthesizing the audio information and the busy signal is set to logic "0". When the synthesizer controller 81 receives the busy signal of logic "0" in step 307, the VOUT subroutine is completed.

The audio information synthesization in the audio information synthesizer 83 is performed by varying, by operation, parameters such as voice volume level and pitch period which form each piece of audio information. The synthesized audio information is converted to an analog signal by a D/A converter. The analog signal passes through a low-pass filter so that the high frequency components thereof are cut off. Thus, the audio information signal is obtained.

On the other hand, when the cover is closed and the door switch is turned on, as described above, the DRC-F is reset in step 127 and the program advances to step 129. It is checked in step 129 if a check lamp (not shown) for indicating jamming is turned on. If the check lamp is lit (jam status), the program advances to step 229. On the other hand, if the check lamp is not lit, the CHK (check) flag is reset in step 131 and the program then advances to step 133. The CHK flag is a flag used for performing an audio output "Please remove paper" once. In step 229, the KEY-F, the PEP-F, the WAT-F and the RDY-F within the RAM 117 are reset and the program advances to step 231. It is checked in step 231 if the CHK-F within the RAM 117 is set, that is, if the audio output "Please remove paper" is already performed. If the CHK-F is reset, the CHK-F is set in step 233 and the program then advances to step 237. On the other hand, if the CHK-F is set, the program advances to step 235. A mode for performing the audio output "Please remove paper" is set in step 237. Further, the VOUT subroutine is called in step 239. When the audio output is completed, the program advances to step 241. It is checked in step 241 whether the top cover is closed. If the top cover is open, that is, if the door switch is turned off, the program advances to step 243. On the other hand, when the top cover is closed, that is when the door switch is turned on, the program advances to step 235. It is judged in step 235 whether the copy button is depressed. If the copy button is depressed, the program advances to step 237. Further, the VOUT subroutine is called and the program returns to step 241.

On the other hand, when the copy button is not depressed, the program returns directly to step 241. In this manner, when jamming occurs, the audio output "Please remove paper" is performed once. Thereafter, every time the copy button is depressed, the same audio output is performed. This series of operations is performed until the top cover is open.

When the top cover is opened and the program advances to step 243, it is judged whether a reset button (not shown) for cancelling the jam status is turned on. If the reset button is depressed, the RST (reset) flag within the RAM 117 is reset in step 245 and the program advances to step 247. The RST flag is a flag used for performing the audio output "Please depress the reset button" once.

It is judged in step 249 whether the copy button is depressed. If the copy button is depressed, the program advances to step 257. On the other hand, when the copy button is not depressed, the program advances to step 251. A mode for performing the audio output "Please depress the reset button" is set in step 257. The VOUT subroutine is called in step 259. When the audio output is completed, the program returns to step 251. It is judged in step 251 whether the top cover is open. If the top cover is open, the RST-F is reset in step 261 and the program returns to step 243. On the other hand, if the top cover is closed, the program advances to step 253. It is judged in step 253 whether the RST-F is set. If the RST-F is set, the program returns to step 243. On the other hand, if the RST-F is reset, the RST-F is set in step 255 and the program advances to step 257. The audio output is performed in step 257. As described above, in the jam status, when the top cover is open in order to remove the copying paper sheet, the audio output is not performed. When the copy button is depressed and then the top cover is closed, or when the top cover is closed and then the copy button is depressed in this condition, the audio output "Please depress the reset button" is performed. This status is maintained until the reset button is depressed.

When the reset button is depressed, as described above, the RST-F is reset in step 245 and the program then advances to step 247. It is checked in step 247 whether a check lamp (not shown) is lit. If the check lamp is not lit, that is, if the jam status is properly cancelled, steps 205, 207, 211, 213 and 215 are executed to close the open top cover and the audio output "Please close the cover" is performed. The wait status is maintained until the top cover is closed. On the other hand, if the check lamp is lit, that is, if the jam status is not cancelled, the program returns to step 237 again and the audio output "Please remove paper" is performed.

Figure 5A:
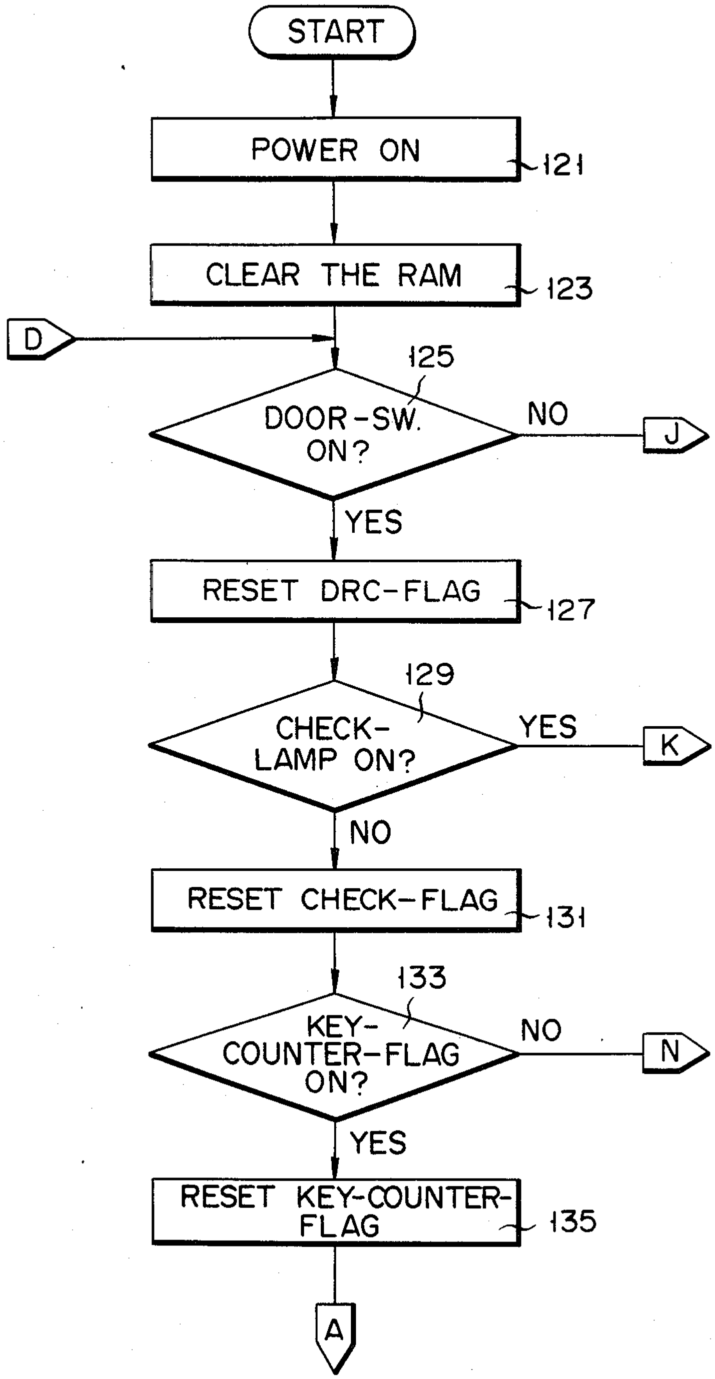
FIGS. 5A through 5P are flow charts for explaining the mode of operation of the electronic copying machine according to the present invention.

On the other hand, if a key counter flag is set in step 133 as shown in FIG. 5A, that is, if the key counter (not shown) is turned off, the program advances to step 217. On the other hand, if the key counter is turned on, the key flag within the RAM 117 is reset in step 135 and the program advances to step 137. The PEP-F, the WAT-F, and the RDY-F within the RAM 117 are reset in step 217 and the program advances to step 219. If the key flag is set, the program advances to step 221. On the other hand, if the key flag is not set, the key flag is set in step 223 and the program advances to step 225. A mode for performing the audio output "Please attach the key counter" is set in step 225. Further, the VOUT subroutine is called in step 227. When the audio output is completed, the program returns to step 125. If the top cover is closed and jamming is not detected, the wait status is initiated until the key counter is attached. When the copy button is depressed in step 221, the program advances to step 225. On the other hand, if the copy button is not depressed, the program returns to step 125. Thus, when the key counter is not attached, the audio output "Please attach the key counter" is performed once. Thereafter, every time the copy button is depressed, the same audio output is performed. This status is maintained until the key counter is attached. In this condition, when the top cover is open, for example, the audio output "Please close the cover" is performed. Further, when the top cover is closed, the audio output "Please attach the key counter" is performed.

It is judged in step 137 whether a paper-out indicator lamp (not shown) is lit. If the paper-out indicator lamp is lit, that is, if the copying paper sheets are empty in the paper feed cassette 19 or 21, the program advances to step 263 of FIG. 5L. On the other hand, if the paper-out indicator lamp is not lit, the PEP-F within the RAM 117 is reset in step 139 and the program advances to step 141. The WAT-F and the RDY-F within the RAM 117 are reset in step 263 and the program advances to step 265. If the PEP-F is set in step 265, the program advances to step 269. On the other hand, if the PEP-F is not set, the PEP-F is set in step 267 and the program advances to step 271. A mode for performing the audio output "Please feed paper" is set in step 271 and the VOUT subroutine is called in step 273. When the audio output is completed, the program returns to step 125. If the top cover is closed, jamming is not detected, and the key counter is attached, the wait status is maintained until the copying paper sheets are supplied and the paper-out indicator lamp is turned off. If the copy button is depressed in step 269, the program advances to step 271. In step 271, the audio output is performed and the program returns to step 125. On the other hand, when the copy button is not depressed, the program returns directly to step 125. Thus, in the paper-out status, the audio output "Please feed paper" is performed once. Thereafter, every time the copy button is depressed, the same audio output is performed. This operation is maintained until the copying paper sheets are supplied. However, when the top cover is open, jamming is detected, and the key counter is turned off, the corresponding audio outputs are performed according to the order of priority. All the audio outputs cannot be simultaneously performed.

Figure 5B:
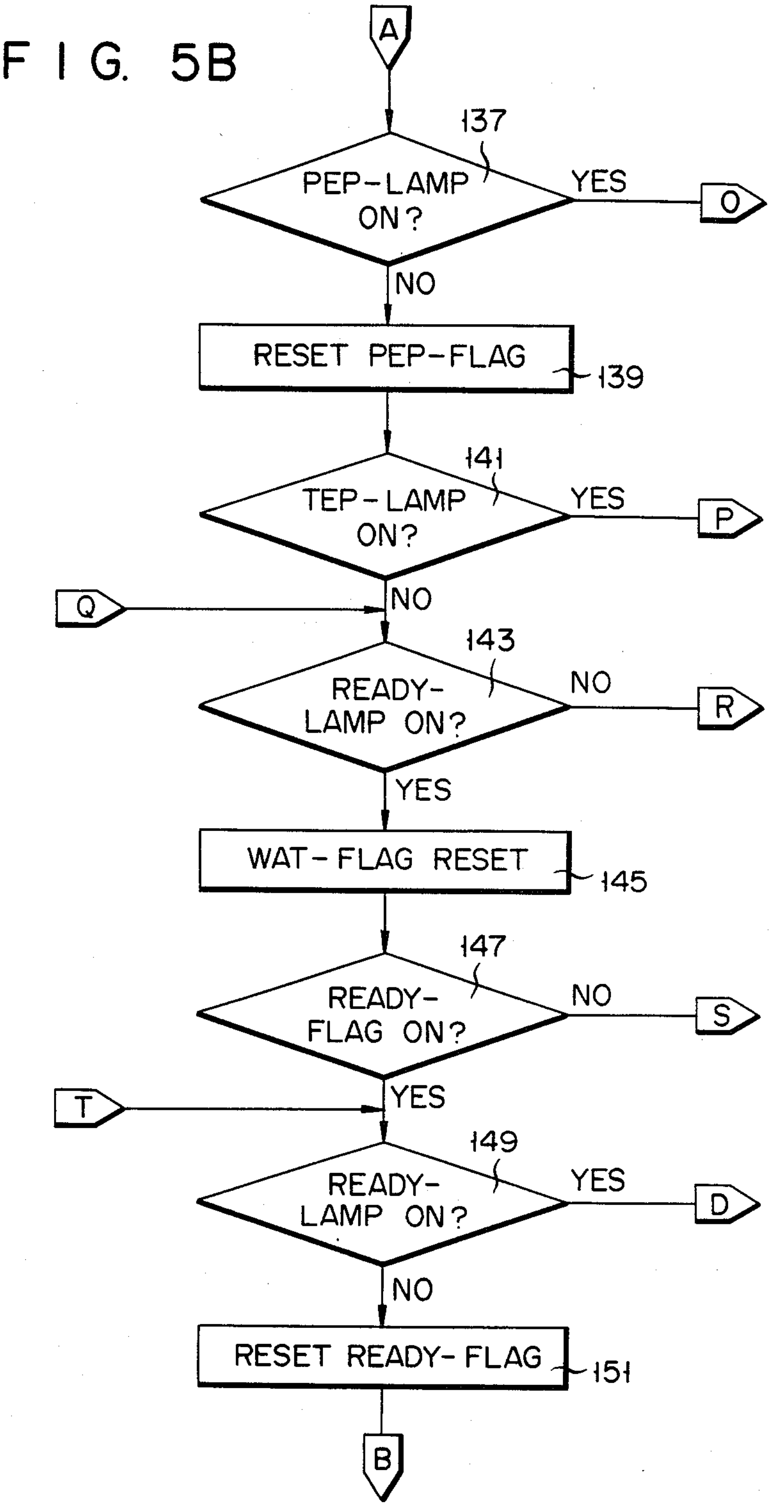
Figure 5C:
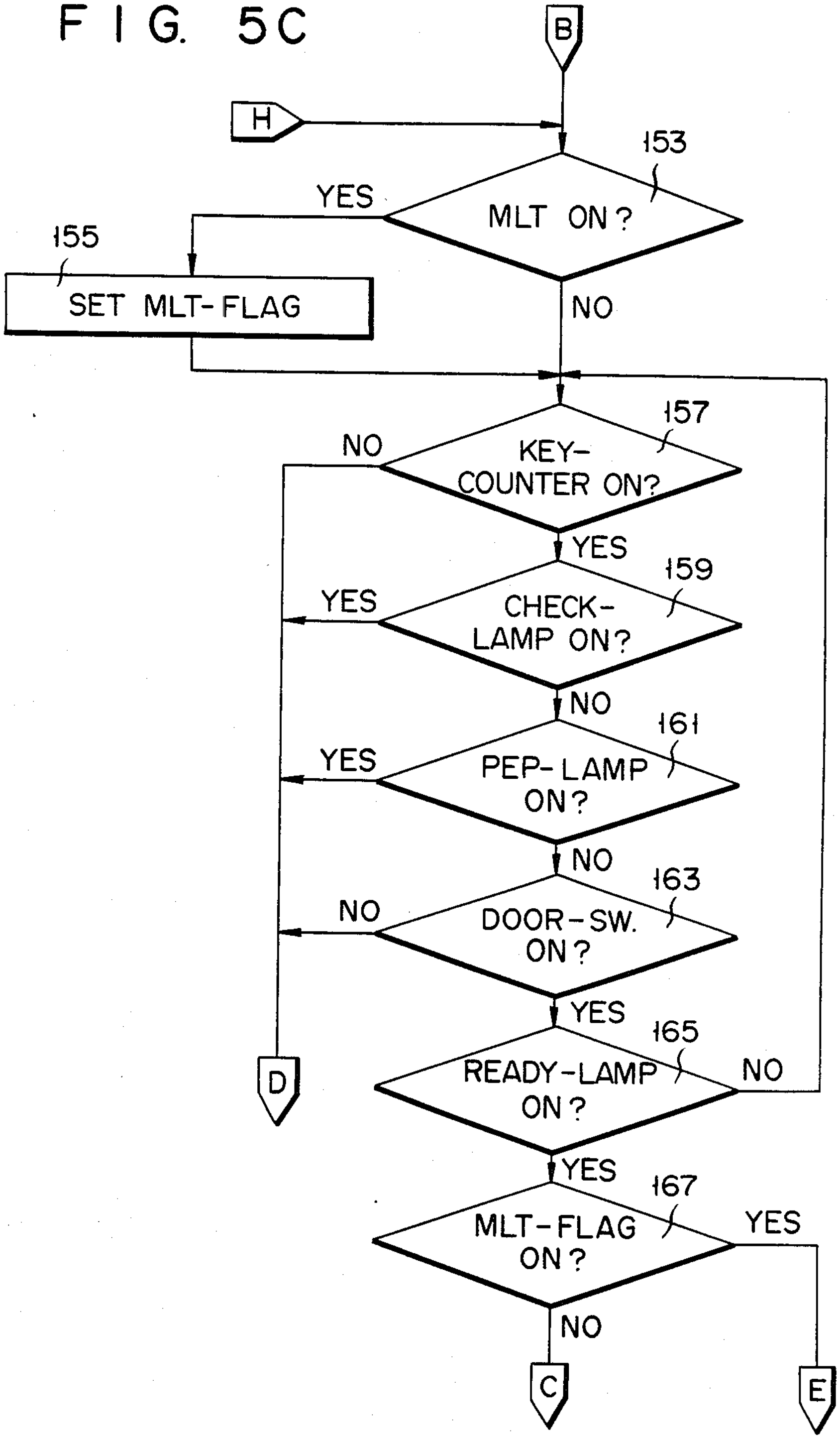
Figure 5D:
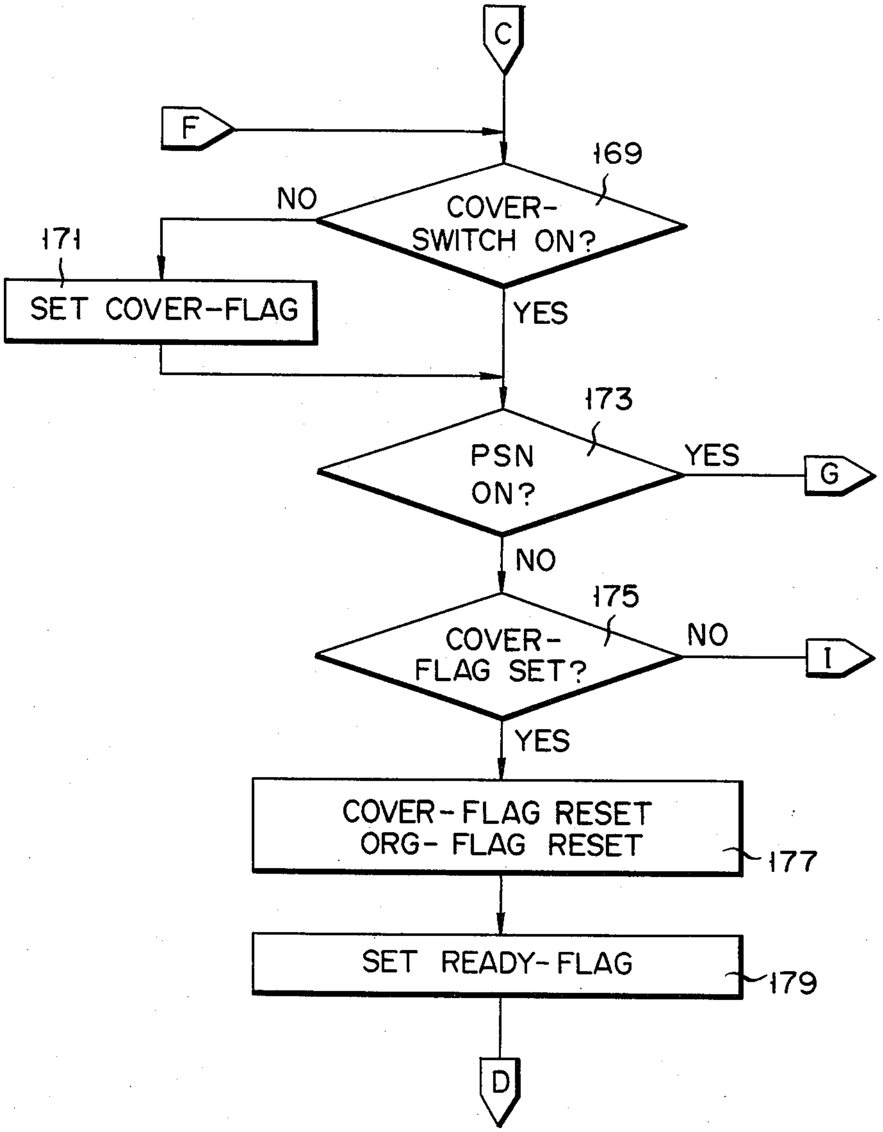
Figure 5E:
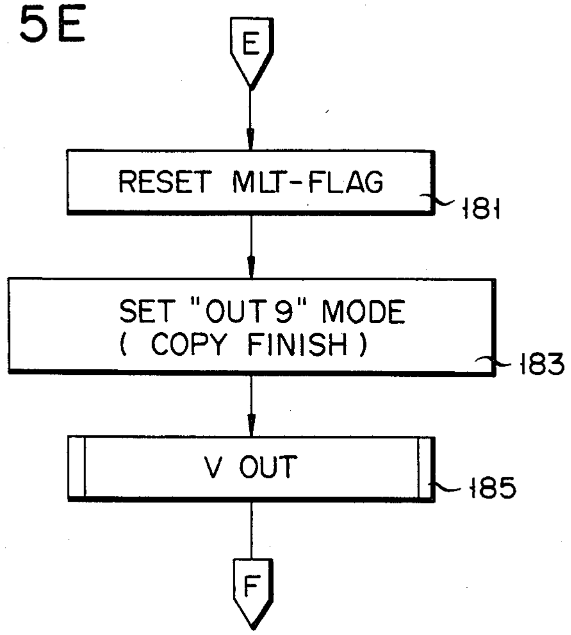
Figure 5F:
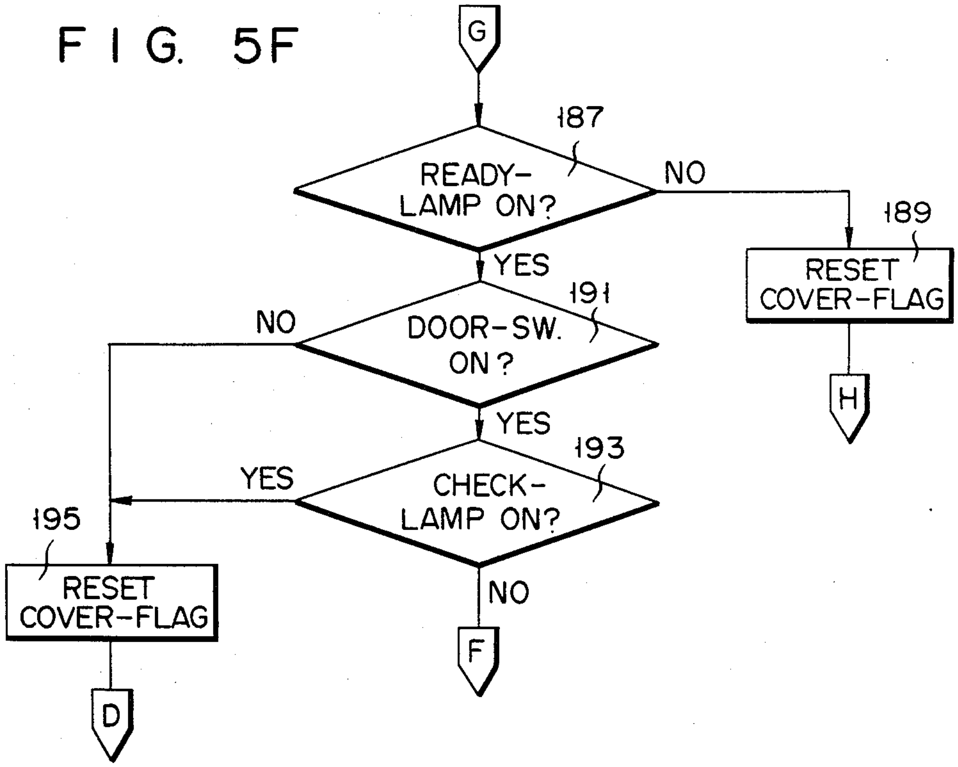
Figure 5G:
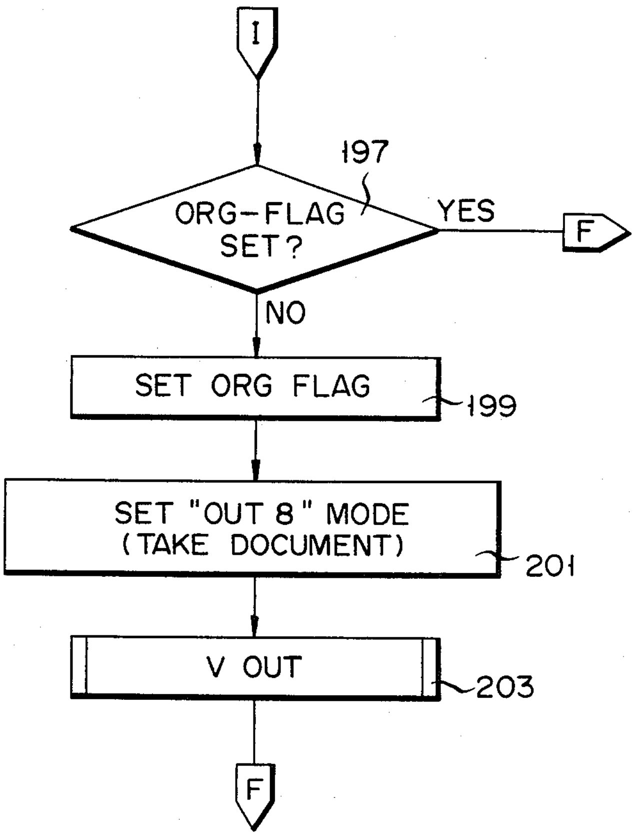
Figure 5H:
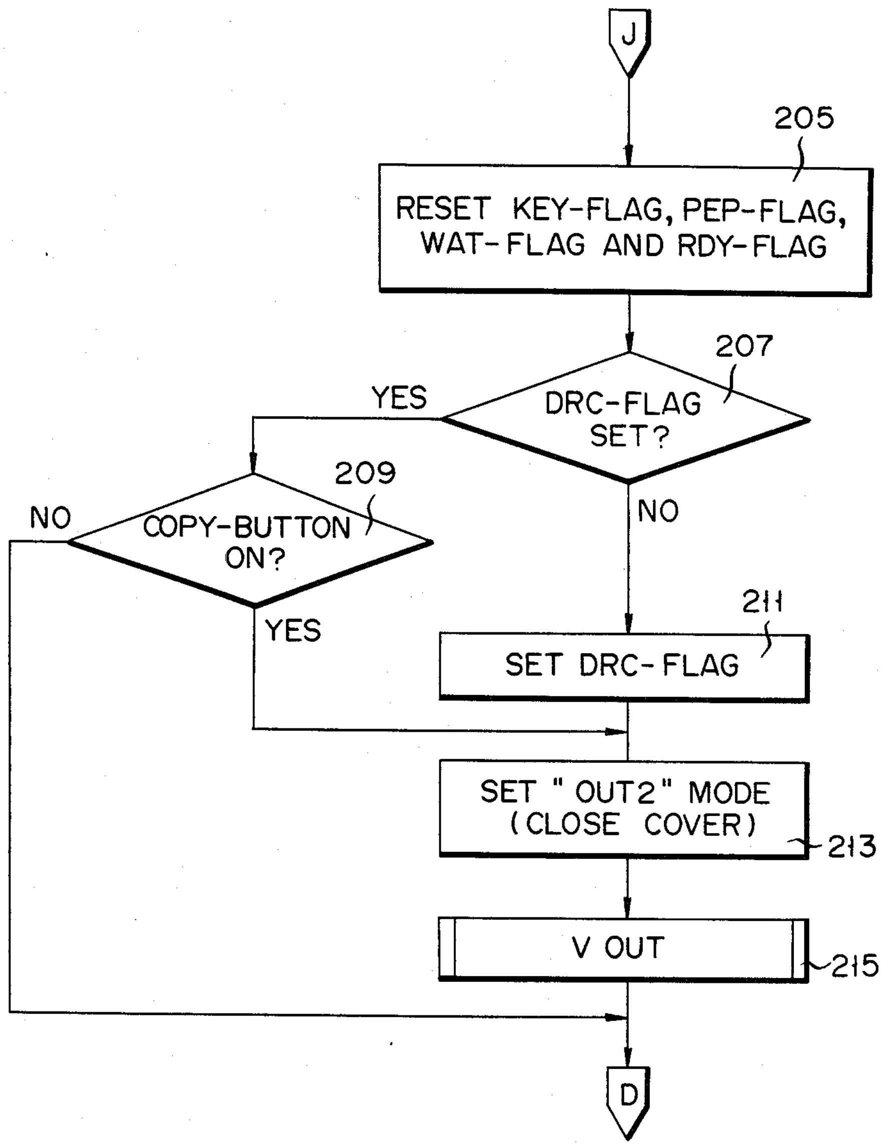
Figure 5I:
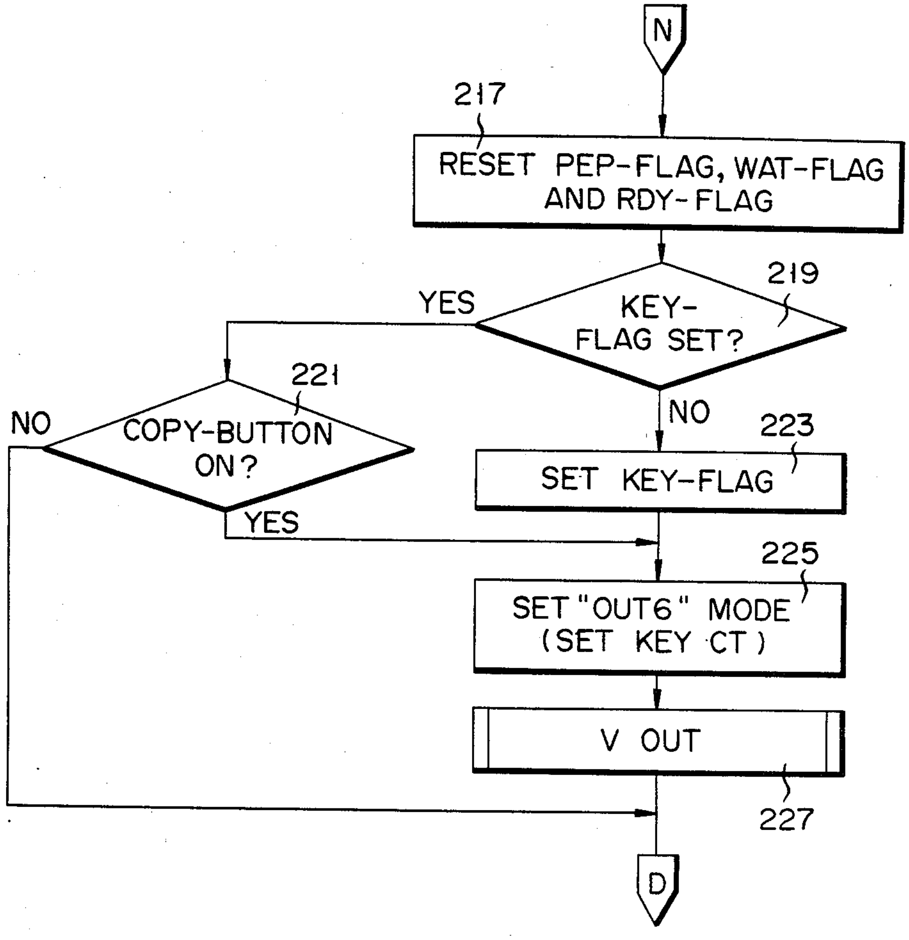
Figure 5J:
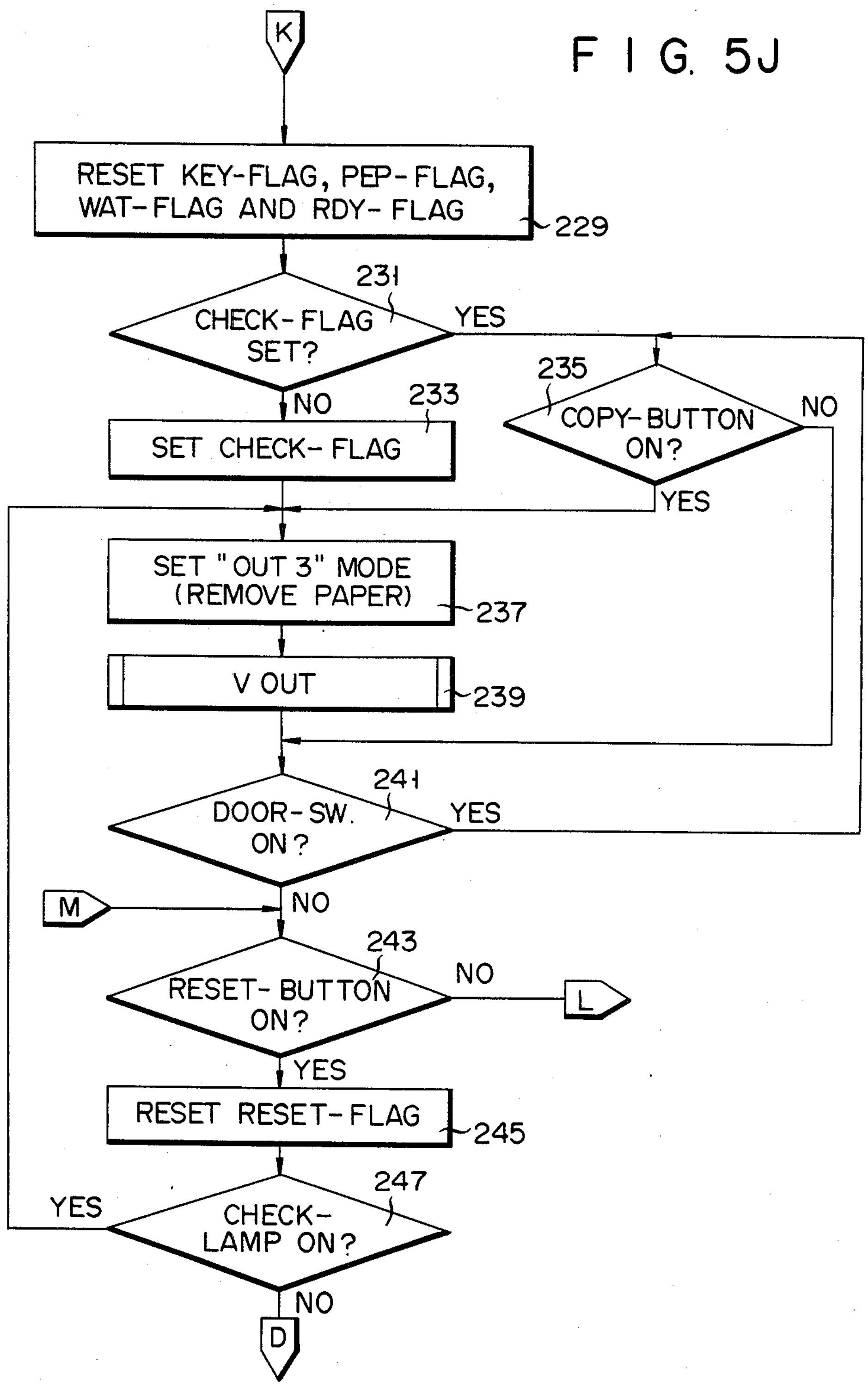
Figure 5K:
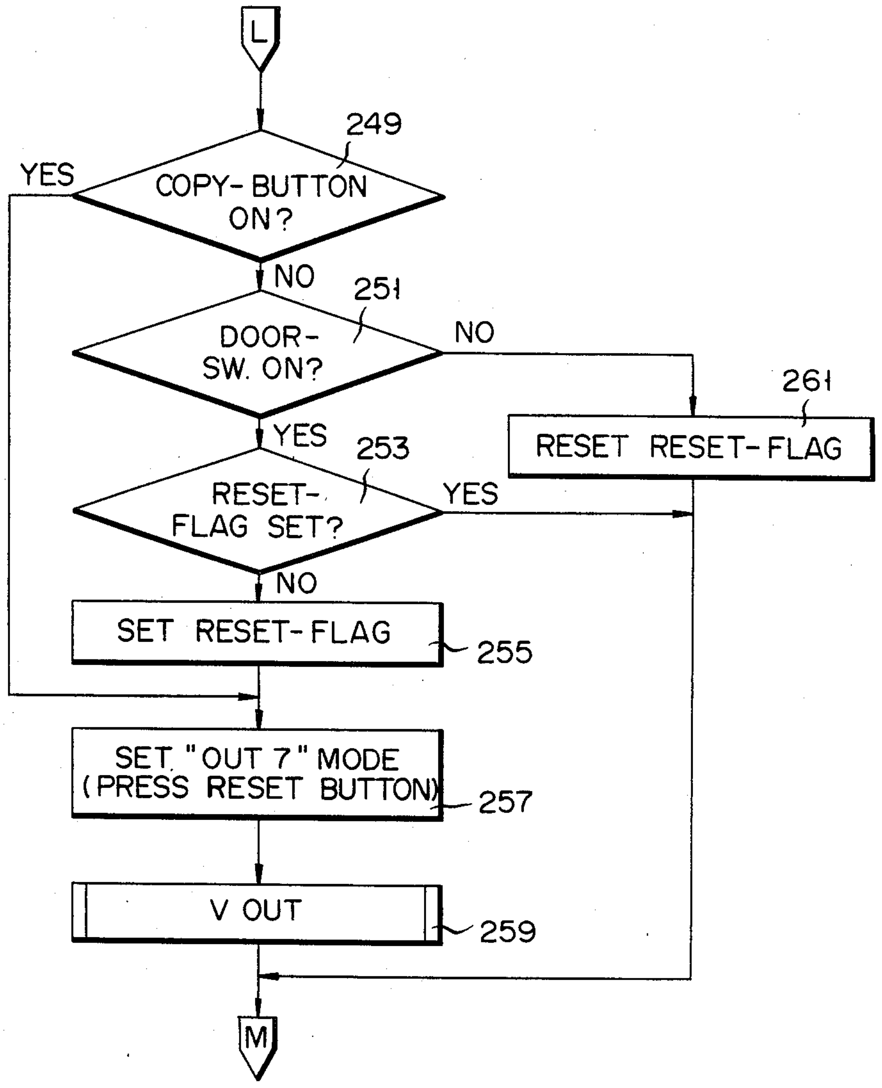
Figure 5L:
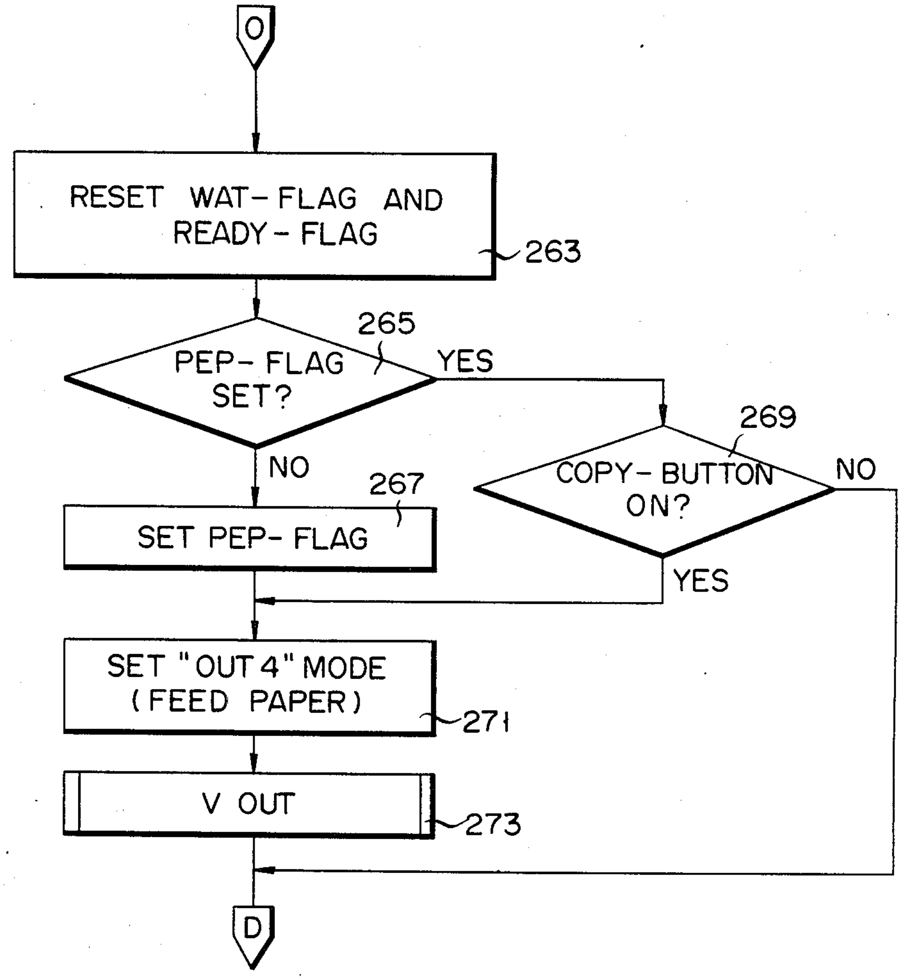
Figure 5M:
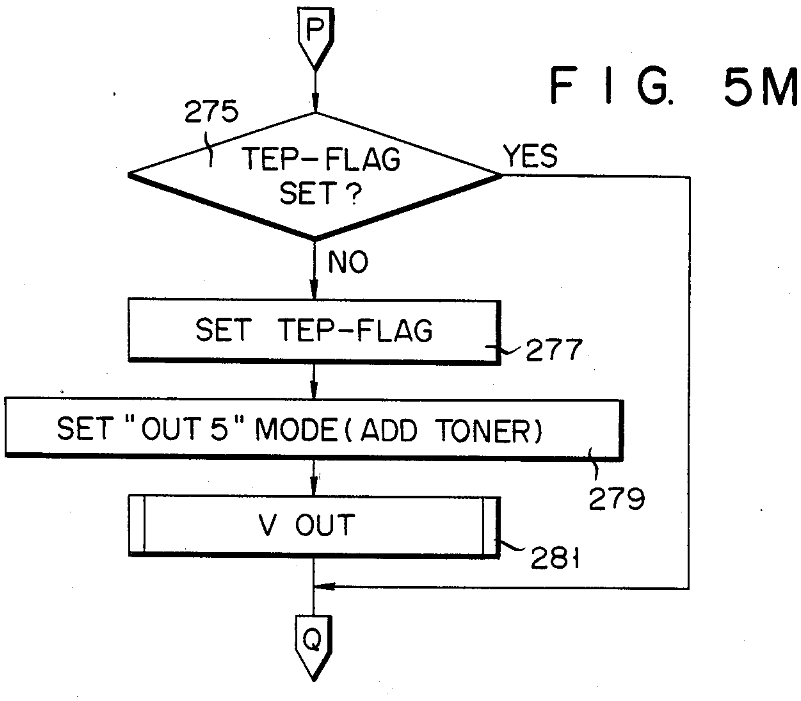

If a toner insufficiency indicator lamp (not shown) is lit in step 141 of FIG. 5B, that is, if the toner is insufficient, the program advances to step 275 of FIG. 5M. On the other hand, if the toner insufficiency indicator lamp is not lit, the program advances to step 143. It is judged in step 275 whether a TEP flag within the RAM 117 is set. If the TEP flag is set, the program returns to step 143. On the other hand, if the TEP flag is not set, the TEP flag is set in step 277 and the program advances to step 279. The TEP flag is a flag used for performing the audio output "Please add toner" once. A mode for performing the audio output "Please add toner" is set in step 279 and the VOUT subroutine is called in step 281. When the audio output is completed, the program moves to step 143. When the toner is insufficient, the audio output "Please add toner" is performed once after power is supplied. Thereafter, the audio output will not be performed. This indicates that copying can be performed even if the toner is insufficient. If the audio output "Please add toner" is repeatedly performed every time the copy button is depressed, the operator will feel restless. For this reason, the audio output is not repeated.

Figure 5N:
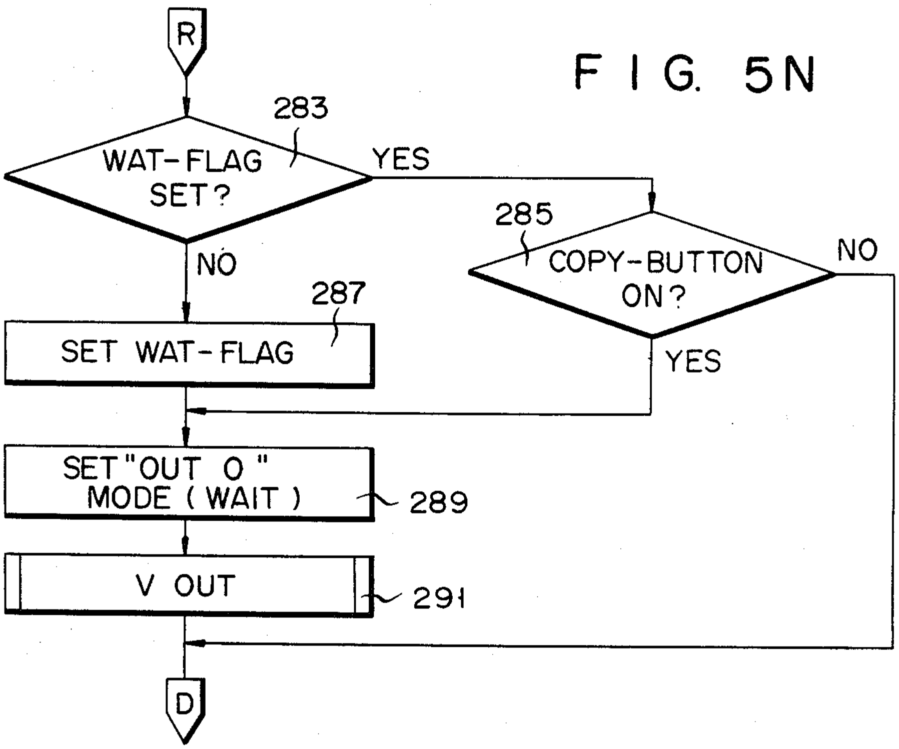
Figure 5O:
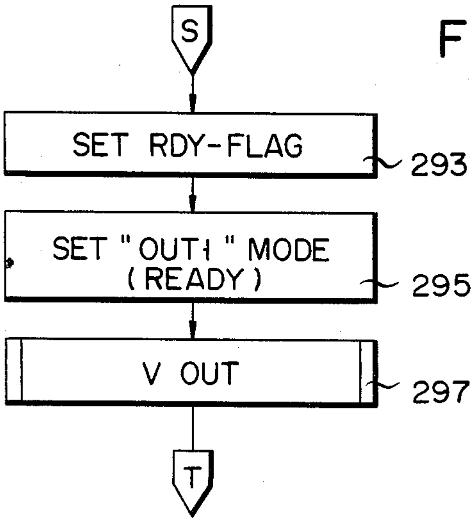
Figure 5P:
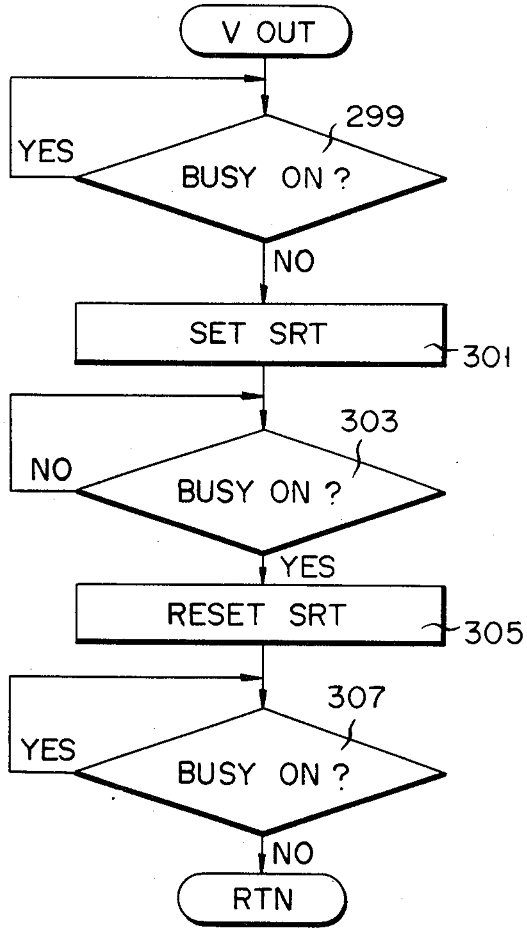

If a ready lamp (not shown) is checked to be off (the wait status) in step 143, the program advances to step 283 of FIG. 5N. On the other hand, if the ready lamp is on (the ready status), the WAT-F within the RAM 117 is reset in step 145 and the program advances to step 147. The WAT-F is a flag used for performing the audio output "Please wait" once. When the ready lamp is turned off, the heat rollers 25 are not heated to a predetermined temperature. If the WAT-F is set in step 283, the program advances to step 285. When it is reset, the WAT-F is set in step 287 and the program advances to step 289. A mode for performing the audio output "Please wait" is set in step 289 and the VOUT subroutine is called in step 291. When the audio output is completed, the program returns to step 125. When the copy button is depressed in step 285, the program advances to step 289 and the audio output is performed. Thereafter, the program returns to step 125. At this time, when the copy button is not depressed, the program returns directly to step 125. In this manner, the audio output "Please wait" is performed once in the wait status. Thereafter, every time the copy button is depressed, the same audio output is performed. This status is maintained until the ready lamp is lit. In this case, if the top cover is open, jamming is detected and the key counter is turned off, the audio outputs are performed according to the order of priority. However, all the audio outputs are not simultaneously performed.

If the RDY-F within the RAM 117 is reset in step 147, the program advances to step 293. On the other hand, if the RDY-F is set, the program advances to the next step 149. When the wait status is changed to the ready status and the ready lamp is turned on, the program advances to step 293 since the RDY-F is reset. A mode for performing the audio output "Ready for copying" is set in step 295 and the VOUT subroutine is called in step 297. When the audio output is completed, the program advances to step 149. The program returns to step 125 in step 149 and the wait status is maintained until the ready lamp is turned off when the copying operation is initiated upon the depression of the copy button. In this manner, when the wait status is changed to the ready status, the audio output "Ready for copying" is performed once. At this time, when the top cover is open, jamming is detected and the key counter is turned off, the audio outputs are performed according to the order of priority. However, all the audio outputs are not performed simultaneously.

When the copying operation is started and the ready lamp is turned off in step 149, the RDY-F is reset in step 151 and the program advances to step 153. It is judged in step 153 whether a MLT (multi) signal is set in step 153. If the MLT signal is reset, the program advances to step 157. On the other hand, if the MLT signal is set, the MLT flag is set and the program advances to step 157. If the preset copying sheet number is set to at least 10, the MLT-F is used as a flag for performing the audio output "Copying is completed" once. It is judged in step 157 through 163 whether the key counter is turned on, jamming is detected, copying paper sheets are left, and the top cover is closed. If the key counter is turned on, jamming is not detected, the copying paper sheets are left in the cassette, and the top cover is closed, the wait status is initialized until the ready lamp is turned on, that is, until copying is completed by a loop of steps 157, 159, 161, 163 and 165. However, when the key counter is turned off, jamming is detected, the paperout status occurs, and the top cover is open, the program returns to step 125 and the audio outputs are performed according to the order of priority.

When the ready lamp is on in step 165, the program advances to step 167. If the MLT-F is set in step 167, the program advances to step 181 of FIG. 5E. The MLT flag is reset in step 181 and a mode for performing the audio output "Copying is completed" is set in step 183. The VOUT subroutine is called in step 185. When the audio output is completed, the program advances to step 169. When the MLT-F is reset in step 167, the program advances to step 169. In this manner, when the preset copying sheet number is at least 10, the audio output "Copying is completed" is performed once.

It is judged in step 169 whether the cover switch arranged on a document table cover (not shown) on the document table 3 is turned on, that is, the document cover is closed. If the cover switch is turned on, the program advances to step 173. On the other hand, if the cover switch is not turned on, the program advances to step 171 and a CVR (cover) flag is set. The program then advances to step 173. The CVR flag is a flag used for storing data for closing or opening the document cover. It is judged in step 173 whether a PSN (person) signal is set to logic "1". The PSN signal is a detection signal for an infrared ray detector or an ultrasonic detector (not shown) disposed in the copying machine main body 1. When a person is located near the copying machine main body 1, the PSN signal is set to logic "1". On the other hand, when the person is away from the copying machine main body 1, the PSN signal is set to logic "0". If the PSN signal is set to logic "0", the program advances to step 175. On the other hand, if the PSN signal is set to logic "1", the program advances to step 187. When the CVR-F is reset in step 175, the program advances to step 197. It is judged in step 197 whether the ORG (original) flag is set. If the ORG-F is set, the program returns to step 169. The ORG-F is a flag used for performing the audio output "Did your take the document?". A mode for performing this audio output is then set in step 201 and the VOUT subroutine is called in step 203. When the audio output is completed, the program returns to step 169. On the other hand, if the CVR-F is set in step 175, that is, if the document cover is open, the CVR-F and the ORG-F are reset in step 177, the RDY-F is set in step 179 and the program returns to step 125. When the RDY lamp is turned off in step 187, the CVR-F is reset in step 189 and the program returns to step 153. On the other hand, if the RDY lamp is turned on, the program advances to step 191. When the cover is open and jamming is detected, the CVR-F is reset in step 195. The program then returns to step 125. On the other hand, when the cover is closed and jamming is not detected, the program returns to step 169. In this manner, when the operator is away from the copying machine main body 1 while the document cover is not open upon the completion of the copying operation, the audio output "Did you take the document?" is performed once. Further, upon the completion of the copying operation, if the document cover is closed even if the operator is away from the copying machine main body 1, the same audio output is performed once. After the audio output is completed and the operator opens the document cover, the initial status in step 125 is restored.

The relations between the audio output contents and audio output timings are summarized as follows:

(a) "Please wait."
  (i) when the copy button is depressed in the wait status,
  (ii) when power is supplied,
(b) "Ready for copying."
  (i) when the wait status is changed to the ready status,
  (ii) after the copying paper sheets are supplied,
(c) "Please remove paper."
  (i) when jamming occurs,
  (ii) when the copy button is depressed while jamming is detected,
  (iii) when power is supplied while jamming is detected,
(d) "Please feed paper."
  (i) when copying paper sheets are not left in the paper feed cassette,
  (ii) when the copy button is depressed while the copying paper sheets are not left in the paper feed cassette,
  (iii) when power is supplied while the copying paper sheets are not left in the paper feed cassette,
(e) "Please add toner."
  (i) when toner is insufficient,
  (ii) when power is supplied while toner is insufficient,
(f) "Did you take the document?"
  (i) when the operator is away from the copying machine main body while the document cover is closed upon the completion of copying,
(g) "Please depress the reset button."
  (i) when the top cover is closed while the reset button is not depressed after jamming is cancelled,
(h) "Please attach the key counter."
  (i) when the copy button is depressed while the key counter is turned off,
  (ii) when power is supplied while the key counter is turned off,
(i) "Please close the cover."
  (i) when the copy button is depressed while the top cover is open,
  (ii) when power is supplied while the top cover is open,
(j) "Copying is completed."
  (i) when the copying operation for the preset copying sheet number of at least 10 is completed,
(k) "Please call for service personnel."
  (i) when the routine checking is required,
  (ii) when power is supplied when the routine checking is required,
(l) "Manual feed is being performed."
  (i) when the copy button is depressed while the manual feed cover is open,
  (ii) when power is supplied while the manual feed cover is open.

The abbreviated symbols are summarized as follows.

PEP-F: paper empty flag,
WAT-F: wait flag,
RDY-F: ready flag,
DRC-F: door close flag,
CHK-F: check flag,
VOUT: voice out,
RST-F: reset flag,
TEP-F: toner empty flag,
MLT-F: multi flag,
CVR-F: cover flag,
PSN: person,
ORG: original,
SRT: start, and
RTN: return.

Figure 6:
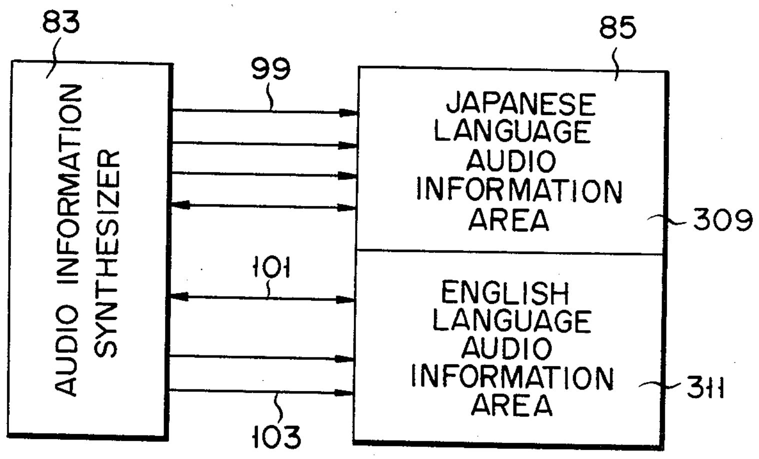
FIGS. 6 and 7 are, respectively, block diagrams of modifications of the control circuit of FIG. 2.
Figure 7:
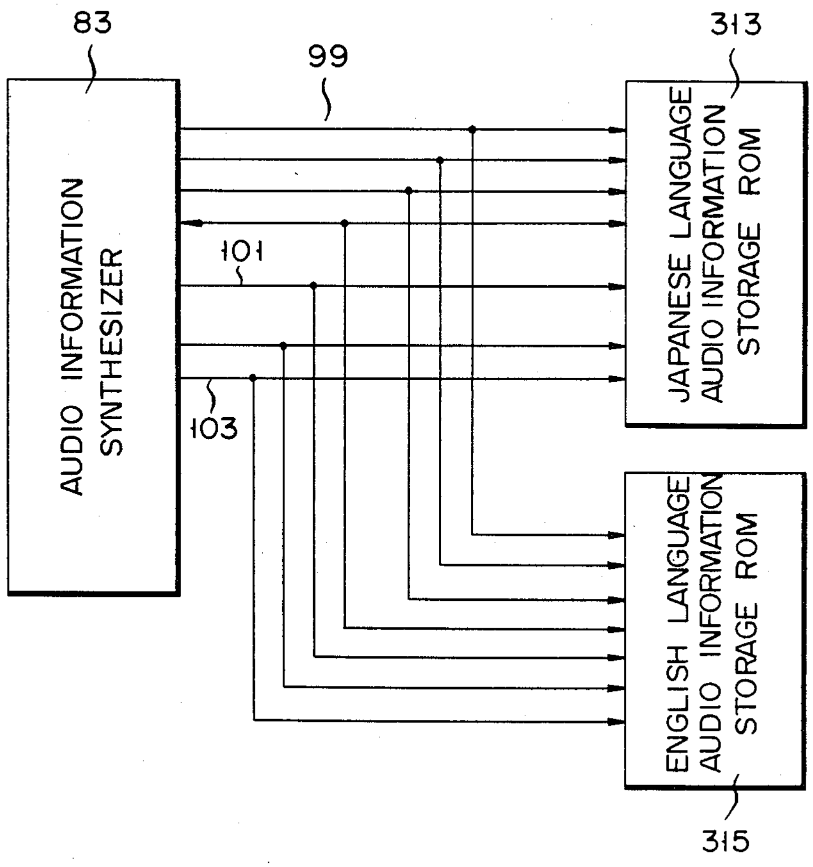

In the above embodiment, a case is described wherein the audio output is performed in Japanese. For example, as shown in FIG. 6, the ROM 85 is divided into a Japanese language audio information area 309 and an English language audio information area 311. Thus, a great number of pieces of audio information for the plurality of languages are stored in the ROM 85. Addresses for the audio output may be arbitrarily accessed to obtain an audio output of a predetermined language, thus maximizing the advantage of the audio output function. Further, as shown in FIG. 7, a Japanese language audio information storage ROM 313 and an English language audio information storage ROM 315 may be independently arranged. If the ROMs may be plugged into or unplugged from a socket, a number of languages may be used for the audio output, thus resulting in convenience. In the above embodiment, if buzzer sounds or chime sounds are produced before the voice is produced, the operator is well prepared for recognition of the voice. Thus, the audio output may be properly heard and understood. In the above embodiment, an audio output for the preset copying sheet number of a least 10 is performed. However, the preset copying sheet number may be arbitrarily selected by the operator for performing the audio output.

Obviously numeral modifications and variations of the present invention are possible in light of the above teachings. It is, therefore, to be understood that written in the scope of the appended claims, the present invention may be practiced otherwise than as specifically described herein.

What we claim is:

1. An electronic copying machine comprising:

a copying machine main body;

fault detecting means for detecting at least one fault in the operation of said copying machine main body, each said fault being correctable by a sequence of manual operations;

operation detecting means for detecting the occurrence of each of said manual operations;

information storage means for storing instructions for said manual operations;

output means for outputting any of said instructions stored in said information storage means; and control means for: (1) causing said output means to output one of said instructions related to the first manual operation in said sequence to correct one of said faults detected by said fault detecting means, (2) causing said output means to output one of said instructions related to the next manual operation in said sequence to correct said detected fault when said operation detecting means detects the occurrence of said manual operation previously instructed by output of said output means, and (3) repeating said function (2) until instructions for all of said manual operations necessary to correct said detected fault have been outputted by said output means.

* * * * *